US012570801B2

(12) United States Patent
Kim et al.

(10) Patent No.: US 12,570,801 B2
(45) Date of Patent: Mar. 10, 2026

(54) POLYIMIDE PRECURSOR COMPOSITION, POLYIMIDE FILM FORMED FROM THE SAME AND METHOD OF MANUFACTURING SEMICONDUCTOR DEVICE USING THE SAME

(71) Applicants: DONGWOO FINE-CHEM CO., LTD., Jeollabuk-do (KR); EcoProHN Co., LTD., Chungcheongbuk-do (KR)

(72) Inventors: Dong Ki Kim, Jeollabuk-do (KR); Young Chul Park, Jeollabuk-do (KR); Eun Sang Lee, Daejeon (KR); Sung Mook Choi, Gyeonggi-do (KR)

(73) Assignees: DONGWOO FINE-CHEM CO., LTD., Jeollabuk-do (KR); EcoProHN Co., LTD., Chungcheongbuk-do (KR)

( * ) Notice: Subject to any disclaimer, the term of this patent is extended or adjusted under 35 U.S.C. 154(b) by 507 days.

(21) Appl. No.: 18/098,281

(22) Filed: Jan. 18, 2023

(65) Prior Publication Data

US 2023/0279183 A1 Sep. 7, 2023

(30) Foreign Application Priority Data

Jan. 20, 2022 (KR) ........................ 10-2022-0008379

(51) Int. Cl.
*C08G 73/10* (2006.01)
*C08J 5/18* (2006.01)
(Continued)

(52) U.S. Cl.
CPC ....... *C08G 73/1007* (2013.01); *C08G 73/105* (2013.01); *C08J 5/18* (2013.01);
(Continued)

(58) Field of Classification Search
CPC ............ C08G 73/1071; C08G 73/1046; C08G 73/1042; C08L 2203/16
See application file for complete search history.

(56) References Cited

U.S. PATENT DOCUMENTS 5,914,385 A 6/1999 Hayashi et al.
6,506,664 B1 * 1/2003 Beyne ................ H01L 23/5385
438/458
(Continued)

FOREIGN PATENT DOCUMENTS

CN 105566630 A 5/2016
CN 108885920 A 11/2018
(Continued)

OTHER PUBLICATIONS

Office action issued on Sep. 30, 2024 from China Patent Office in a counterpart China Patent Application No. 202310058217.7 (all the cited references are listed in this IDS.) (English translation is also submitted herewith.).
(Continued)

*Primary Examiner* — Mark S Kaucher
(74) *Attorney, Agent, or Firm* — The PL Law Group, PLLC

(57) ABSTRACT

A polyimide precursor composition according to an exemplary embodiment includes an imide precursor having an organic group derived from a cyclic ether group-containing compound. A polyimide film formed using the polyimide precursor composition has improved heat resistance and mechanical properties, and has high absorbance in a wavelength range in an ultraviolet region.

15 Claims, 4 Drawing Sheets

(51) Int. Cl.
*C08L 79/08* (2006.01)
*H10P 52/00* (2026.01)
*H10P 72/70* (2026.01)

(52) U.S. Cl.
CPC .............. *C08L 79/08* (2013.01); *H10P 52/00* (2026.01); *H10P 72/7402* (2026.01); *C08J 2379/08* (2013.01); *C08L 2203/16* (2013.01); *H10P 72/7412* (2026.01); *H10P 72/744* (2026.01)

(56) References Cited

U.S. PATENT DOCUMENTS

| | | | | |
|---|---|---|---|---|
| 2014/0066590 | A1* | 3/2014 | Suzuki | C08G 73/101 549/459 |
| 2019/0031844 | A1* | 1/2019 | Kato | H01B 3/306 |
| 2019/0352463 | A1 | 11/2019 | Maitani et al. | |
| 2022/0010069 | A1 | 1/2022 | Park et al. | |

FOREIGN PATENT DOCUMENTS

| | | | | |
|---|---|---|---|---|
| CN | 110546746 | A | 12/2019 | |
| EP | 3 438 992 | A1 | 2/2019 | |
| JP | H02-261862 | A | 10/1990 | |
| JP | 2003-292619 | A | 10/2003 | |
| JP | 2014-118519 | A | 6/2014 | |
| JP | 2017-141317 | A | 8/2017 | |
| JP | 2017-188438 | A | 10/2017 | |
| JP | 2021-150571 | A | 9/2021 | |
| KR | 10-2007-0114280 | A | 11/2007 | |
| KR | 10-2014-0122206 | A | 10/2014 | |
| KR | 10-2014-0144528 | A | 12/2014 | |
| KR | 10-2016-0103259 | A | 9/2016 | |
| WO | WO 2012/106191 | A2 | 8/2012 | |
| WO | WO 2018/194133 | A1 | 10/2018 | |
| WO | WO-2020246349 | A1 * | 12/2020 | C08F 290/145 |

OTHER PUBLICATIONS

Notice of Allowance issued on Mar. 5, 2024 from Japan Intellectual Property Office in a counterpart Japanese Patent Application No. 2023-003098 (all the cited references are listed in this IDS.) (English translation is also submitted herewith.).

Office action issued on Nov. 21, 2023 from Japan Intellectual Property Office in a counterpart Japanese Patent Application No. 2023-003098 (all the cited references are listed in this IDS.) (English translation is also submitted herewith.).

* cited by examiner

POLYIMIDE PRECURSOR COMPOSITION, POLYIMIDE FILM FORMED FROM THE SAME AND METHOD OF MANUFACTURING SEMICONDUCTOR DEVICE USING THE SAME

PRIORITY

The application claims the benefit under 35 USC § 119 of Korean Patent Application No. 10-2022-0008379 filed on Jan. 20, 2022 in the Korean Intellectual Property Office, the entire disclosures of which is incorporated herein by reference for all purposes.

BACKGROUND

1. Technical Field

The present invention relates to a polyimide precursor composition, a polyimide film formed from the same and a method of manufacturing a semiconductor device using the same. More particularly, the present invention relates to a polyimide precursor composition capable of forming a polyimide structure, a polyimide film formed from the same and a method of manufacturing a semiconductor device using the same.

2. Description of the Related Art

A polyimide (PI) copolymer is a polymer having a heteroimide ring in a main chain, and may be prepared by a condensation polymerization of an aromatic dianhydride and an aromatic diamine followed by an imidization. The polyimide copolymer has high heat resistance, flame retardancy, mechanical properties, low permittivity, etc., and may be applied to a wide range of fields such as an electronic material, a coating material, a molding material, a composite material, etc.

Recently, in the field of an electronic device such as a semiconductor device and a display device, a critical dimension of patterns are being reduced to implement a high-resolution structure. For example, as a dimension of an electronic device such as a smart phone are reduced in a weight, a thickness and a size, demands for thin-scaled compact devices with a high integration degree of electronic components such as a semiconductor device, a PCB, a flip chip, etc., are increased.

In a fabrication of the semiconductor device, a grinding process such as a back grinding may be performed on a semiconductor substrate to reduce the size and thickness of the semiconductor device. In this case, the semiconductor device may be attached on a support substrate using an adhesive.

However, due to the adhesive attached to the semiconductor substrate, warpage of the substrate may occur during the fabricating process or after the fabrication, and the semiconductor device may be damaged during a peeling or a releasing. Thus, developments of a release layer having improved peeling properties and heat resistance, and being capable of suppressing damages during the fabricating process is needed.

SUMMARY

According to an aspect of the present invention, there is provided a polyimide composition having improved reliability and stability.

According to an aspect of the present invention, there is provided a polyimide film formed from the polyimide composition and having heat-resistance and debonding property.

According to an aspect of the present invention, there is provided a method of manufacturing a semiconductor device using the polyimide precursor composition.

(1) A polyimide precursor composition including an imide precursor represented by Chemical Formula 1 or Chemical Formula 2.

[Chemical Formula 1]

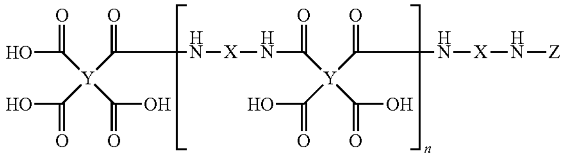

[Chemical Formula 2]

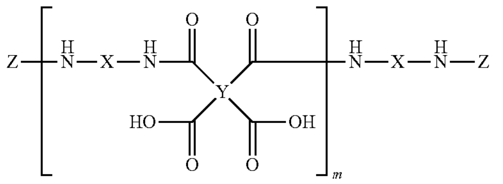

In Chemical Formulae 1 and 2, X is a divalent aliphatic hydrocarbon group having 6 to 30 carbon atoms or a divalent aromatic hydrocarbon group having 6 to 30 carbon atoms, Y is a tetravalent aliphatic hydrocarbon group having 4 to 30 carbon atoms or a tetravalent aromatic hydrocarbon group having 6 to 30 carbon atoms, Z is a moiety derived from a cyclic ether group-containing compound having 4 to 30 carbon atoms, and n and m are each an integer from 5 to 100.

(2) The polyimide precursor composition according to the above (1), wherein the cyclic ether group-containing compound further contains a linear ether group or an ester group (—COO—) in addition to the cyclic ether group.

(3) The polyimide precursor composition according to the above (2), wherein the cyclic ether group-containing compound includes at least one selected from the group consisting of t-butyl glycidyl ether, neopentyl glycol diglycidyl ether, glycidyl propargyl ether, glycidyl phenyl ether, glycidyl methyl ether, glycidyl methacrylate, glycidyl lauryl ether, glycidyl isopropyl ether, glycidyl acrylate, glycidyl 4-t-butylbenzoate, glycidyl 2-methoxyphenyl ether, ethylene glycol diglycidyl ether, ethyl glycidyl ether, diglycidyl 4-cyclohexene-1,2-dicarboxylate, diglycidyl 1,2-cyclohexanedicarboxylate, butyl glycidyl ether, benzyl glycidyl ether, allyl glycidyl ether, 2,2-bis(4-glycidyloxyphenyl) propane and 1,4-butanediol diglycidyl ether.

(4) The polyimide precursor composition according to the above (1), wherein the imide precursor is a product of a monomer blend including a diamine compound, a dianhydride compound and the cyclic ether group-containing compound.

(5) The polyimide precursor composition according to the above (4), wherein the diamine compound includes a compound represented by Chemical Formula 3.

$$H_2N—X—NH_2$$ [Chemical Formula 3]

In Chemical Formula 3, X is a divalent aliphatic hydrocarbon group having 6 to carbon atoms or a divalent aromatic hydrocarbon group having 6 to 30 carbon atoms.

(6) The polyimide precursor composition according to the above (5), wherein the diamine compound includes at least one of compounds represented by Chemical Formulae 5 to 9.

[Chemical Formula 5]

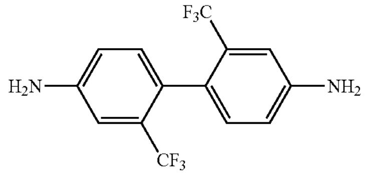

[Chemical Formula 6]

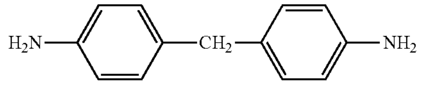

[Chemical Formula 7]

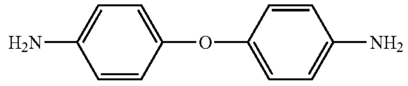

[Chemical Formula 8]

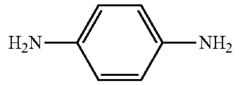

[Chemical Formula 9]

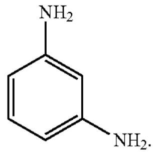

(7) The polyimide precursor composition according to the above (4), wherein the dianhydride compound includes a compound represented by Chemical Formula 4,

[Chemical Formula 4]

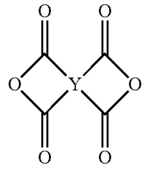

In Chemical Formula 4, Y is a tetravalent aliphatic hydrocarbon group having 4 to 30 carbon atoms or a tetravalent aromatic hydrocarbon group having 6 to 30 carbon atoms.

(8) The polyimide precursor composition according to the above (7), wherein the dianhydride compound includes at least one of the compounds represented by Chemical Formulae 10 to 14:

[Chemical Formula 10]

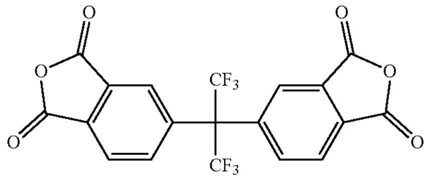

[Chemical Formula 11]

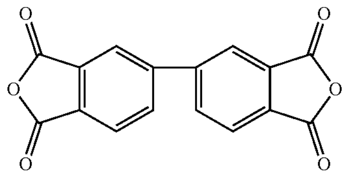

[Chemical Formula 12]

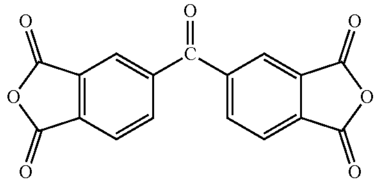

[Chemical Formula 13]

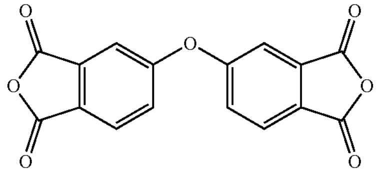

[Chemical Formula 14]

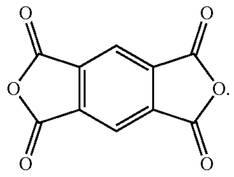

(9) The polyimide precursor composition according to the above (4), wherein a content of the cyclic ether group-containing compound in the monomer blend is in a range from 10 moles to 150 moles based on 100 moles of the dianhydride compound.

(10) The polyimide precursor composition according to the above (4), wherein a content of the diamine compound in the monomer blend is in a range from 80 moles to 120 moles based on 100 moles of the dianhydride compound.

(11) A polyimide film including a cured product of the polyimide precursor composition of the above embodiments.

(12) The polyimide film according to the above (11), wherein the polyimide film is used as a release layer for a laser lift off (LLO).

(13) The polyimide film according to the above (11), wherein a light transmittance at a wavelength of 308 nm measured at a thickness of 4,500 Å is 25% or less.

(14) A method of manufacturing a semiconductor device, including: forming a carrier stack that includes a carrier substrate and a release layer formed from the polyimide precursor composition of the above embodiments on a top surface of the semiconductor substrate; polishing a bottom surface of the semiconductor substrate; and removing the carrier stack from the semiconductor substrate.

(15) The method according to the above (14), wherein removing the carrier laminate from the semiconductor substrate includes irradiating the release layer with laser light; and detaching the release layer from the semiconductor substrate.

(16) The method according to the above (14), further including forming a circuit device on the top surface of the semiconductor substrate before forming the carrier stack on the top surface of the semiconductor substrate, wherein polishing the bottom surface of the semiconductor substrate includes turning over the semiconductor substrate so that the carrier stack faces downward.

(17) The method according to the above (14), further including forming a pressure-sensitive adhesive layer on the top surface of the semiconductor substrate before forming the carrier stack on the top surface of the semiconductor substrate; and removing the pressure-sensitive adhesive layer from the semiconductor substrate after removing the carrier stack from the semiconductor substrate.

A polyimide precursor composition according to exemplary embodiments may include an imide precursor formed from a diamine compound and a dianhydride compound. Thus, polyimide having high heat resistance and mechanical properties may be formed from the polyimide precursor composition.

The imide precursor may have an organic group derived from a compound containing a cyclic ether group at a molecular terminal end. Due to a structure derived from the compound containing a cyclic ether group, time-dependent stability of the polyimide precursor composition may be improved. Therefore, even when being stored under harsh conditions of high temperature/high humidity for a long period, the polyimide precursor composition may have a low viscosity, and a thickness change ratio of a film formed from the polyimide precursor composition may become small.

Additionally, the polyimide film formed from the polyimide precursor composition may have high absorbance in a wavelength range of an ultraviolet region, and thus laser debonding properties may be improved. Thus, even when the polyimide film is irradiated with, e.g., a low-energy exfoliation laser, for example, debonding properties with respect to a semiconductor substrate may be improved.

The polyimide film may be applied to a fabrication of a semiconductor device, and may be used, e.g., as a release layer between the semiconductor device and a carrier substrate. In this case, the semiconductor device may be easily separated from the carrier substrate without physical damages such as cracks or fractures and chemical damages such as corrosion.

DETAILED DESCRIPTION

Figure 1:
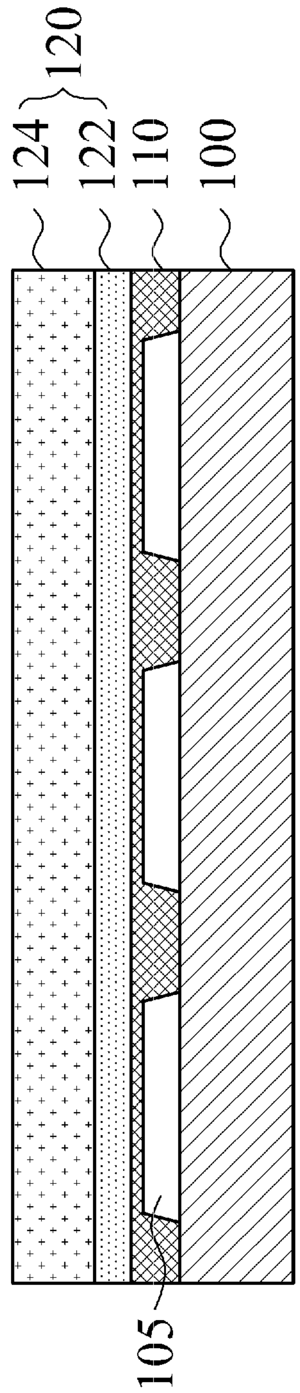
FIGS. 1 to 4 are schematic cross-sectional views illustrating a method of manufacturing a semiconductor device in accordance with exemplary embodiments.

A polyimide precursor composition (hereinafter, that may be abbreviated as a precursor composition) according to embodiments of the present invention may include structures derived from a diamine compound, a dianhydride compound and a cyclic ether group-containing compound.

Further, a polyimide film formed from the polyimide precursor composition and a method of manufacturing a semiconductor device using the polyimide precursor composition are provided.

Hereinafter, embodiments of the present invention will be described in detail.

<Polyimide Precursor Composition>

A polyimide precursor composition according to exemplary embodiments may include an imide precursor represented by Chemical Formula 1 or Chemical Formula 2 below.

[Chemical Formula 1]

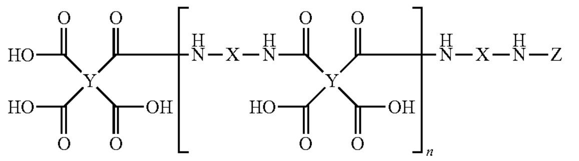

[Chemical Formula 2]

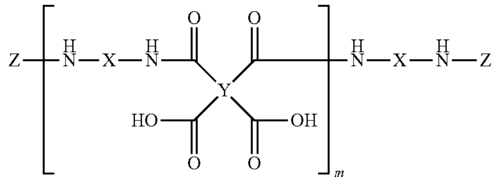

In Chemical Formulae 1 and 2, X may be a divalent organic group having 6 to 30 carbon atoms. For example, X may be a divalent aliphatic hydrocarbon group having 6 to 30 carbon atoms or a divalent aromatic hydrocarbon group having 6 to 30 carbon atoms.

The term "aliphatic hydrocarbon group" as used herein may refer to an organic group that includes a straight-chain, branched-chain or alicyclic hydrocarbon group and does not contain an aromatic ring. The term "aromatic hydrocarbon group" as used herein may refer to an organic group containing at least one aromatic ring.

For example, the divalent aliphatic hydrocarbon group may be an alkylene group, an alkenylene group, an alkynylene group, a cycloalkylene group, a cycloalkenylene group, or a cycloalkynylene group. For example, the divalent aromatic hydrocarbon group may be an arylene group, an alkylarylene group or an arylalkylene group.

The divalent aliphatic hydrocarbon group and the divalent aromatic hydrocarbon group may contain at least one heteroatom selected from among oxygen, nitrogen, sulfur and fluorine. The hetero atom may be present in a main chain or a branched chain. For example, the divalent organic group may include a trifluoromethyl group ($—CF_3$), an ether group (—O—), a thioether group. (—S—), a carbonyl group (—C(=O)—), a sulfinyl group (—(S=O)—) or a sulfonyl group ($—SO_2—$).

Preferably, X may be a divalent aromatic hydrocarbon group having 6 to 30 carbon atoms.

Y may be a tetravalent organic group having 4 to 30 carbon atoms. For example, Y may be a tetravalent aliphatic hydrocarbon group having 4 to 30 carbon atoms or a tetravalent aromatic hydrocarbon group having 6 to 30 carbon atoms.

The tetravalent organic group may contain at least one heteroatom selected from among oxygen, nitrogen, sulfur and fluorine. The hetero atom may be present in a main chain or a branch. For example, the tetravalent organic group may include a trifluoromethyl group ($—CF_3$), an ether group (—O—), a thioether group (—S—) or a carbonyl group (—C(=O)—), a sulfinyl group (—(S=O)—) or a sulfonyl group ($—SO_2—$), etc.

Preferably, Y may be a tetravalent aromatic hydrocarbon group having 6 to 30 carbon atoms.

Z may be an organic group derived from a cyclic ether group-containing compound having 4 to 30 carbon atoms. For example, Z may include a moiety derived from the cyclic ether group-containing compound. The term "cyclic ether group" as used herein may refer to a functional group having a ring structure such as a monocyclic structure, a polycyclic structure or a heterocyclic structure and containing an ether group in the ring structure.

The imide precursor may have the Z unit derived from the cyclic ether group-containing compound, so that a laser peeling property of the polyimide film may be improved, and time-dependent stability and storage stability of the composition may be improved.

In some embodiments, the cyclic ether group-containing compound may further include a linear ether group (—O—) or an ester group (—C(=O)O—) in addition to the cyclic ether group. The term "linear ether group" as used herein may refer to a functional group containing an ether group in a chain of a linear structure.

For example, Z may be an aliphatic hydrocarbon group having 4 to 30 carbon atoms and including a linear ether group or an ester group, or an aromatic hydrocarbon group having 6 to 30 carbon atoms and including a linear ether group or an ester group.

In this case, decomposition and gelation of the imide precursor due to a long-term storage of the composition may be prevented while maintaining high absorbance of the imide precursor to light in an ultraviolet region. Accordingly, time-dependent stability of the resin composition may be improved, and physical properties and laser debonding properties of the polyimide film formed therefrom may be improved.

In Chemical Formulae 1 and 2, n and m may each be an integer of 5 to 100.

For example, when n and m are less than 5, heat resistance and mechanical properties of the polyimide formed from the imide precursor may be degraded. For example, when n and m are greater than 100, storage stability of the composition may be degraded, and a viscosity of the composition may be increased during a long-term storage. Accordingly, physical properties and film-forming properties of the polyimide film may be deteriorated.

In exemplary embodiments, the imide precursor may be a product of a monomer blend including a diamine compound, a dianhydride compound and the cyclic ether group-containing compound. For example, the imide precursor may include a copolymer of the diamine compound, the dianhydride compound, and the cyclic ether group-containing compound, In an embodiment, X in Chemical Formulae 1 and 2 may have a structure derived from the diamine compound, and may be, e.g., a moiety from the diamine compound. In an embodiment, Y in Chemical Formulae 1 and 2 may be a structure derived from the dianhydride compound, and may be, e.g., a moiety from the dianhydride compound.

In some embodiments, the diamine compound may include a compound represented by Chemical Formula 3 below.

$H_2N—C—NH_2$ [Chemical Formula 3]

In Chemical Formula 3, X may be a divalent organic group having 6 to 30 carbon atoms, e.g., a divalent aliphatic hydrocarbon group having 6 to 30 carbon atoms or a divalent aromatic hydrocarbon group having 6 to 30 carbon atoms.

Preferably, X may be the divalent aromatic hydrocarbon group having 6 to 30 carbon atoms.

For example, the diamine compound may include 3,4-oxydianiline, 4,4-oxydianiline (ODA), 4,4-methylenedianiline, 1,3-bis(3-aminophenoxy) benzene, 1,4-bis(4-aminophenoxy) benzene, bis[4-(3-aminophenoxy)phenyl]-sulfone, bis[4-(4-aminophenoxy)phenyl]-sulfone, 2,2-bis (trifluoromethyl) benzidine, 2,2-bis[4-(4-aminophenoxy)-phenyl]hexafluoropropane), 2,2-bis(trifluoromethyl) benzidine (TFMB), 3,3-sulfonyldianiline, 4,4-diaminodiphenylsulfone, 4,4-(1,3-phenylenedioxy) dianiline, 9,9-bis(4-amino-3-fluorophenyl)fluorine, 4-aminophenyl 4-aminobenzoate, 4,4-diaminobenzanilide, 9,9-bis(4-aminophenyl)fluorine, etc. These may be used alone or in combination thereof.

For example, the diamine compound may include at least one of compounds represented by Chemical Formulae 5 to 9 below.

[Chemical Formula 5]

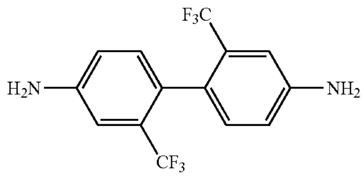

[Chemical Formula 6]

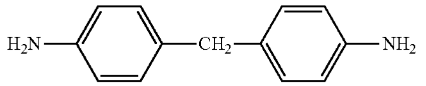

[Chemical Formula 7]

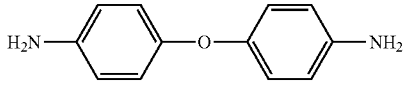

[Chemical Formula 8]

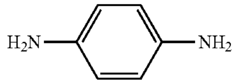

[Chemical Formula 9]

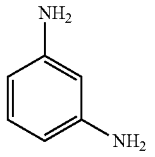

In some embodiments, the dianhydride compound may include a compound as represented by Chemical Formula 4 below.

[Chemical Formula 4]

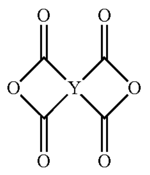

In Chemical Formula 4, Y may be a tetravalent organic group having 4 to 30 carbon atoms, e.g., an aliphatic hydrocarbon group having 4 to 30 carbon atoms or a tetravalent aromatic hydrocarbon group having 6 to 30 carbon atoms.

Preferably, Y may be a tetravalent aromatic hydrocarbon group having 6 to 30 carbon atoms.

For example, the dianhydride compound may include 3,3',4,4'-benzophenone tetracarboxylic dianhydride (BTDA), pyromellitic dianhydride (PMDA), 3,3',4,4'-biphenyltetracarboxylic acid dianhydride (BPDA), 2,3,3',4-biphenyltetra carboxylic acid dianhydride (α-BPDA) 4,4-(hexafluoroisopropylidene)diphthalic anhydride (6FDA), 4,4'-oxydiphthalic anhydride (ODPA), 3,3',4,4'-diphenylsulfone-tetracarboxylic dianhydride (DSDA), 2,2-bis[4-(3,4-dicarboxyphenoxy) phenyl] propane dianhydride (BPADA), hydroquinone diphthalic anhydride (HQDA), 1,2,4,5-cyclohexane-tetracarboxylic dianhydride (CHDA), etc. These may be used alone or in a combination thereof.

For example, the dianhydride compound may include at least one of the compounds represented by Chemical Formulae 10 to 14 below.

[Chemical Formula 10]

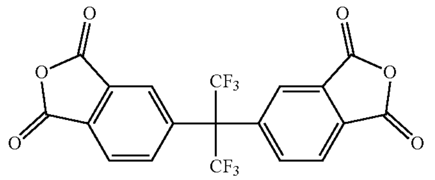

[Chemical Formula 11]

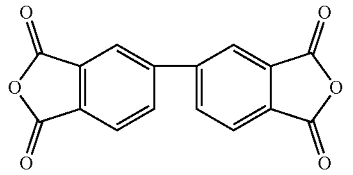

[Chemical Formula 12]

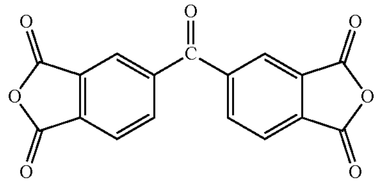

[Chemical Formula 13]

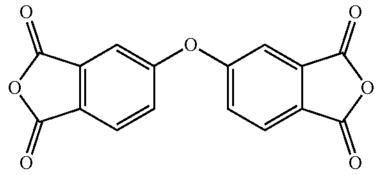

[Chemical Formula 14]

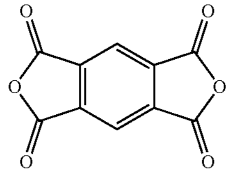

In exemplary embodiments, the cyclic ether group-containing compound may include an epoxy group-containing compound. In this case, a reactivity between the cyclic ether group-containing compound and an amine group may be improved due to the epoxy group. Accordingly, an unreacted ratio of the cyclic ether group-containing compound may be reduced during a polymerization reaction, and a self-cross-linking reaction between the cyclic ether-containing compounds may be suppressed, thereby improving structural stability and tome-dependent stability of the imide precursor.

In some embodiments, the epoxy group-containing compound may include at least one of tert-butyl glycidyl ether, neopentyl glycol diglycidyl ether, glycidyl propargyl ether, glycidyl phenyl ether, glycidyl methyl ether, glycidyl methacrylate, glycidyl lauryl ether, glycidyl isopropyl ether, glycidyl acrylate, glycidyl 4-t-butylbenzoate, glycidyl 2-methoxyphenyl ether, ethylene glycol diglycidyl ether, ethyl glycidyl ether, diglycidyl 4-cyclohexene-1,2-dicarboxylate, diglycidyl 1,2-cyclohexanedicarboxylate, butyl glycidyl ether, benzyl glycidyl ether, allyl glycidyl ether, 2,2-bis(4-glycidyloxyphenyl) propane, 1,4-butanediol diglycidyl ether.

In exemplary embodiments, a content of the diamine compound in the monomer blend may be in a range from 80 moles to 120 moles, preferably from 90 moles to 110 moles, more preferably from 95 moles to 110 moles, based on 100 moles of the dianhydride compound.

Within the above range, reactivity and efficiency of the diamine compound and the dianhydride compound may be improved, and an imide precursor having an appropriate molecular weight and a high degree of polymerization may be formed. Additionally, mechanical properties and thermal stability of the polyimide film formed therefrom may be improved.

In exemplary embodiments, a content of the cyclic ether group-containing compound in the monomer blend may be in a range from 10 moles to 150 moles, preferably from 50 moles to 100 moles, based on 100 moles of the dianhydride compound.

For example, when the content of the cyclic ether group-containing compound is less than 10 moles, a reactivity between the cyclic ether group-containing compound and a terminal amine group of the polyamic acid may be deteriorated. Accordingly, an unreacted polyamic acid, e.g., an imide precursor in which a unit derived from the cyclic ether group-containing compound is not bonded to a terminal end may be produced. Accordingly, yield of the imide precursor represented by Chemical Formula 1 or Chemical Formula 2 may be decreased, and time-dependent stability and storage property of the resin composition may be degraded.

For example, when the content of the cyclic ether group-containing compound is greater than 150 moles, the cyclic ether group-containing compounds may react with each other. In this case, the reactivity between the terminal amine group of the polyamic acid compound and the cyclic ether group-containing compound may be decreased, and yield of the imide precursor may also be decreased. Accordingly, time-dependent stability of the polyimide precursor composition may be deteriorated, and heat resistance and mechanical properties of the polyimide film may be deteriorated due to the self-reacting cyclic ether group-containing compound.

In an embodiment, the imide precursor may be formed by reacting a polyamic acid compound formed by reacting the diamine compound and the dianhydride compound with the cyclic ether group-containing compound.

For example, the polyamic acid compound may be prepared by mixing and reacting the diamine compound and a dianhydride compound at a temperature in a range from 0° C. to 20° C. for 24 hours to 48 hours. In this case, a polyamic acid having an amide structure may be formed by ringopening an acid anhydride group of the dianhydride monomer to be condensated with the amine group (—$NH_2$) of the diamine monomer.

In an embodiment, the polyamic acid compound having a carboxyl group and an amine group at both ends may be prepared by mixing and reacting the polyamic acid and water at a temperature in a range from 20° C. to 70° C. for 12 hours to 48 hours.

Water may induce a decomposition reaction of the polyamic acid compound, and may control a molecular weight and a viscosity of the imide precursor. For example, the imide precursor having a desired level of the viscosity may be prepared by adjusting a content of water that reacts with the polyamic acid compound.

For example, an amount of water added may be in a range from 0.1 moles to 10 moles based on 100 moles of the dianhydride compound. If the water content is 0.1 mol or less, the viscosity of the imide precursor may be increased and coating properties and film-forming properties may be deteriorated. If the water content is greater than 10 moles, the molecular weight of the imide precursor may be lowered, and the physical properties of the polyimide may be deteriorated.

The prepared polyamic acid compound and the cyclic ether group-containing compound may be mixed and reacted at a temperature in a range from 20° C. to 70° C. for 24 hours to 72 hours to prepare the imide precursor represented by Chemical Formula 1 or 2.

In this case, the cyclic ether group of the cyclic ether group-containing compound may be ring-opened to be condensated with the amine group (—$NH_2$) located at the terminal end of the polyamic acid compound. Thus, the Z unit derived from the cyclic ether group-containing compound may be located at the end of the imide precursor.

In exemplary embodiments, the resin composition may further include a surfactant and/or a solvent.

For example, the solvent may include propylene glycol monomethyl ether acetate, propylene glycol monoethyl ether acetate, cyclohexanone, ethyl 3-ethoxypropionate, methyl 3-methoxypropionate, 1-methyl-2-pyrrolidone, N,N-dimethylpropionamide, diethylacetamide, N,N-dimethylacetamide, 3-methoxy-N,N-dimethylpropionamide, 1-ethyl-2-pyrrolidone, N,N-dimethylisobutyl amide, N,N-diethylformamide, N,N-dimethylformamide, N-methylformamide, N-ethylformamide, 1,3-dimethyl-2-imidazolidinone, γ-butyrolactone, α-acetolactone, β-propiolactone, δ-valerolactone, etc. These may be used alone or in a combination thereof.

For example, the surfactant may include polyoxyethylene alkyl ether, polyoxyethylene alkyl ether, polyethylene glycol diester, sorbitan fatty ester, fatty acid-modified polyester, tertiary amine-modified polyurethane, polyethyleneimine, etc. A commercially available surfactant may include KP (manufactured by Shin-Etsu Chemical Industry Co., Ltd.), POLYFLOW (manufactured by Kyoeisha Chemical Co., Ltd.), EFTOP (manufactured by Tochem Products), Megafac (MEGAFAC). (manufactured by Dainippon Ink Chemical Co., Ltd.), Flourad (manufactured by Sumitomo 3M Co., Ltd.), Asahi guard, Surflon (manufactured by Asahi Glass Co., Ltd.), SOLSPERSE (manufactured by Zeneca Co., Ltd.), EFKA (manufactured by EFKA Chemicals), PB 821 (manufactured by Ajinomoto Co., Ltd.). These may be used alone or in a combination thereof.

In an embodiment, a content of the surfactant may be in a range from 0.01 parts by weight to 10 parts by weight based on 100 parts by weight of the imide precursor.

Within the above range, applicability and coatability of the resin composition may be improved, and a thickness uniformity and a film formability of a coating layer may be improved. Additionally, a thin coating layer may be formed so that a microfabrication may be implemented in a manufacturing process of a semiconductor device.

For example, a coating method of the resin composition may include a spin coating, a slit coating, a dip coating, a spray coating, a dispensing, a screen printing, an inkjet printing, an offset printing, a knife coating, a roll coating, a curtain coating, etc.

<Polyimide Film>

A polyimide film according to exemplary embodiments may include a cured product of the polyimide precursor composition as described above. For example, the polyimide film may include polyimide formed by an imidization of an imide precursor. The imide precursor may be converted into a polyimide structure through a baking or thermal curing process.

The polyimide precursor composition may be coated on a substrate, and then may be thermally cured to form the polyimide film. In exemplary embodiments, the thermal curing process may include a low-temperature curing process performed at a temperature of about 350° C. or less. In some embodiments, the thermal curing process may be performed at a temperature in a range from 100° C. to 300° C.

In exemplary embodiments, a light transmittance of the polyimide film measured at a thickness of 4,500 Å and a wavelength of 308 nm may be 25% or less. For example, the polyimide film may have a high absorbance and a low sensitivity for a wavelength of 308 nm. Thus, the polyimide film may absorb most of a laser energy in the 308 nm wavelength range emitted from a laser source, and polyimide may be easily decomposed even with a short irradiation time and a small amount of light.

In some embodiments, the polyimide film may have a glass transition temperature (Tg) of 320° C. or more, for example, at a temperature in a range from 320° C. to 350° C. For example, the glass transition temperature may be measured by raising a temperature from 25° C. to 400° C. at a heating rate of 10° C./min.

In some embodiments, a thermal decomposition temperature (Tdl %) of the polyimide film may be 350° C. or higher, preferably 370° C. or higher, and more preferably 380° C. or higher. For example, the thermal decomposition temperature may be a temperature when a weight is reduced by 1% compared to an initial weight by heating at a heating rate of 10° C./min from a room temperature under a nitrogen gas atmosphere.

Within the above range, the thermal stability of the polyimide film may be improved. Accordingly, shrinkage, breakage and lifting of the polyimide film due to a heat applied during a fabrication of the semiconductor device or a polishing process such as a CMP process may be prevented.

Additionally, the imide precursor according to exemplary embodiments may have the Z unit derived from an epoxy compound at an end of the molecular structure to have high laser energy margin and improved heat resistance. Thus, the polyimide film formed from the above-described resin composition may have improved debonding properties and enhanced thermal stability.

For example, the polyimide film may be used as a release layer used for a laser-lift off (LLO) in the manufacturing process of the semiconductor device.

<Method of Manufacturing Semiconductor Device>

FIGS. 1 to 4 are schematic cross-sectional views illustrating a method of manufacturing a semiconductor device in accordance with exemplary embodiments.

Referring to FIG. 1, a carrier stack 120 including a release layer 122 and a carrier substrate 124 may be formed on a top surface of a semiconductor substrate 100. For example, the release layer 122 may be disposed on the top surface of the semiconductor substrate 100, and the carrier substrate 124 may be disposed on a top surface of the release layer 122.

The release layer 122 may include a cured product of the polyimide precursor composition as described above.

In an embodiment, the polyimide precursor composition may be coated on the top surface of the semiconductor substrate 100, and then heated and dried the composition to form a coating layer. Thereafter, the carrier substrate 124 may be attached on the coating layer, and the imide precursor may be imidized by thermally curing the coating layer. Accordingly, the release layer 122 including polyimide may be formed on the semiconductor substrate 100.

In an embodiment, the release layer 122 may be formed by coating the above-described polyimide precursor composition on a bottom surface of the carrier substrate 124 and then heating and drying the composition. Thereafter, the carrier stack 120 may be attached to the top surface of the semiconductor substrate 100 such that the release layer 122 may face the top surface of the semiconductor substrate 100.

The semiconductor substrate 100 may include a single semiconductor substrate such as a silicon substrate, a germanium substrate or a silicon-germanium substrate, or a composite substrate such as a silicon-on-insulator (SOI) substrate or a germanium-on-insulator substrate (GOI), a metal oxide polycrystalline substrate, etc.

The carrier substrate 124 may be a glass substrate or may include a semiconductor material such as a single-crystal silicon, a single-crystal germanium or polysilicon.

In some embodiments, a circuit device 105 may be formed on a top surface of the semiconductor substrate 100. For example, the circuit device 105 may be formed on the top surface of the semiconductor substrate 100 before forming the carrier stack 120.

For example, the circuit device 105 may include a transistor element such as a source, a drain, a gate electrode, a capacitor electrode, a contact, a circuit pattern, a wiring, etc., or a conductive pattern such as a common electrode, a pixel electrode and a diode element such as an organic light emitting layer (EL).

In an embodiment, a pressure-sensitive adhesive layer 110 may be formed on the top surface of the semiconductor substrate 100 before forming the carrier stack 120. For example, a pressure-sensitive adhesive composition may be applied on the top surface of the semiconductor substrate 100 and then cured to form the pressure-sensitive adhesive layer 110. Thereafter, the release layer 120 may be formed on a top surface of the pressure-sensitive adhesive layer 110.

For example, the pressure-sensitive adhesive layer 110 may include a resin having low adhesive properties and a low peel strength, and may include, e.g., a siloxane-based resin or an acrylic resin.

Figure 2:
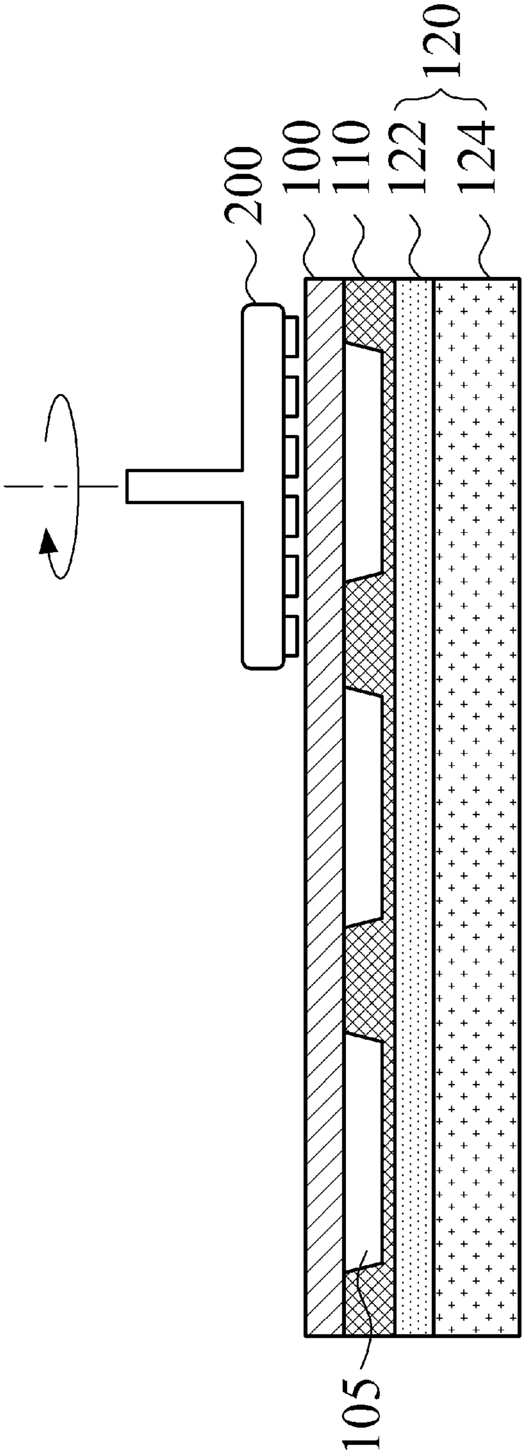

Referring to FIG. 2, a bottom surface of the semiconductor substrate 100 may be planarized by a polishing. In an embodiment, the semiconductor substrate 100 on which the carrier stack 120 is formed may be loaded into a polishing apparatus 200 and a back grinding process may be performed.

For example, the semiconductor substrate 100 may be turned over so that the carrier stack 120 faces down in the polishing apparatus. In this case, the bottom surface of the semiconductor substrate 100 may face a polishing pad of the polishing apparatus 200.

The polishing process may be performed so that the circuit device 105 formed on the top surface of the semiconductor substrate 100 may not be exposed. The polishing process may be performed while the semiconductor substrate 100 is supported by the carrier substrate 130, so that the bottom surface of the semiconductor substrate 100 may be uniformly polished without damaging the circuit device 105. Accordingly, the thin-layered, light-weighted and highly-integrated semiconductor device may be achieved.

In some embodiments, the polishing process may be performed by a super fine grinding process or a chemical mechanical polishing (CMP) process. In an embodiment, the polishing process may be performed as the CMP process.

Figure 3:
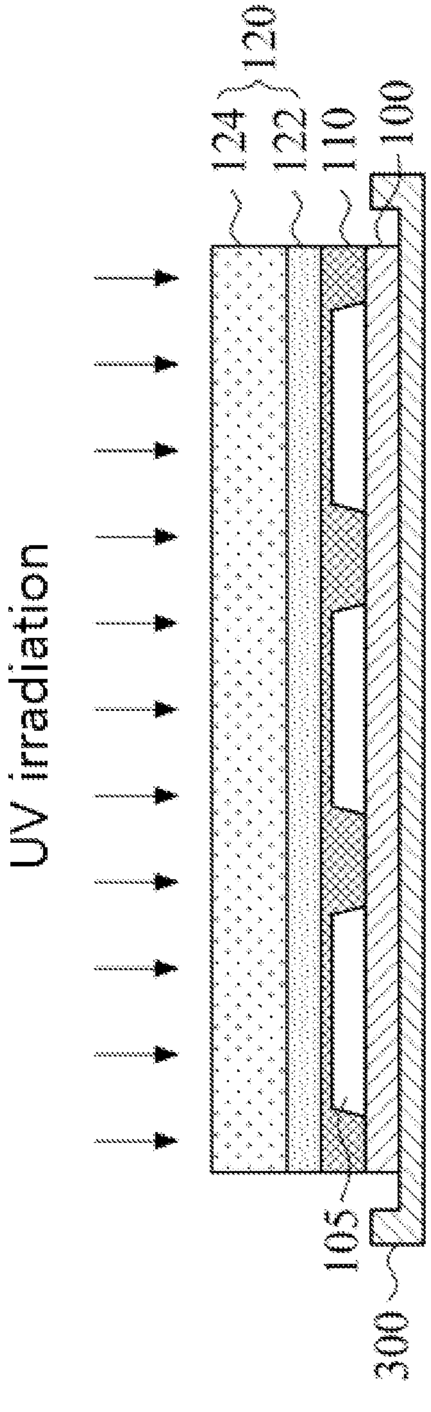
Figure 4:
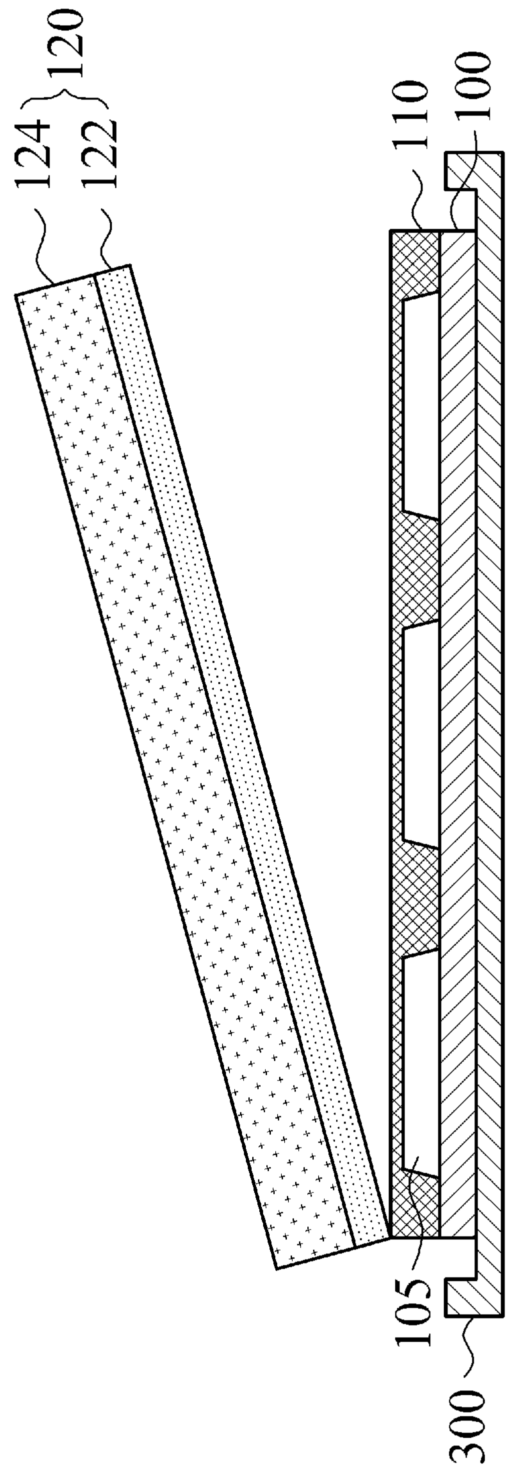

Referring to FIGS. 3 and 4, a light in an ultraviolet region may be irradiated onto the release layer 122. For example, a laser light in a wavelength range from 290 nm to 380 nm may be irradiated.

For example, when the release layer 122 is irradiated with the laser light having a wavelength in the above range, polyimide may be carbonized and a contact surface of the release layer 122 with the semiconductor substrate 100 or the pressure-sensitive adhesive layer 110 may be decomposed. Thus, the release layer 122 may be delaminated from the semiconductor substrate 100 or the pressure-sensitive adhesive layer 110.

The detachments process of the carrier substrate 124 from the semiconductor substrate 100 may include a heat debonding process in which the carrier stack 120 is separated by a heat, a mechanical debonding process in which the carrier laminate 120 is mechanically separated, or a solvent debonding process of separating the carrier laminate 120 by dissolving the release layer 122 in an organic solvent. However, the above-described detachments processes are performed at a high temperature using strong mechanical force, a solvent, etc., to cause cracks, damages or corrosion of the semiconductor device.

In the method of manufacturing a semiconductor device according to exemplary embodiments, the release layer 122 includes polyimide formed from the above-described imide precursor, and a laser lift-off (LLO) process may be performed. Accordingly, the release layer 122 may be delaminated by a relatively small force by the irradiation of the laser light.

For example, polyimide may have strong absorption properties with respect to a light in the ultraviolet region, for example, having a wavelength of 308 nm due to the imide structure included in the main chain. Thus, energy may be concentrated in a region where the laser light is irradiated, and high heat may be generated in the region. In this case, polyimide may be decomposed due to thermal energy generated in the release layer 122 or a chemical bond between the surface of the pressure-sensitive adhesive layer 110 and polyimide may be decomposed, and thus the release layer 122 may be delaminated from the pressure-sensitive adhesive layer.

Therefore, as the release layer 122 has high absorption properties for the light in a wavelength range from 290 nm to 380 nm, a laser energy density (E/D) required for the laser lift-off process may be decreased. In this case, a time for the detachment may be shortened, processability may be improved, and damages to the semiconductor substrate 100 due to the irradiated laser may be prevented.

The release layer 122 and the carrier substrate 124 may be separated from the semiconductor substrate 100, so that a semiconductor device including the semiconductor substrate 100 on which the circuit device 105 is formed may be provided.

For example, a force may be vertically applied toward a top surface of the carrier substrate 124 while holding one end of the release layer 122 so that the carrier stack 120 is separated from the semiconductor substrate 100 or the pressure-sensitive adhesive layer 110

In some embodiments, the adhesive layer 110 may be further included between the semiconductor substrate 100 and the release layer 122. In this case, the adhesive layer 110 may be separated from the semiconductor substrate 100 to provide the semiconductor device. The pressure-sensitive adhesive layer 110 may have a low adhesive strength to be easily peeled-off without damaging the circuit device 105 even with a low peeling force.

In an embodiment, the bottom surface of the semiconductor substrate 100 may be attached to a dicing tape 300 before the release layer 120 is separated from the semiconductor substrate 100. The semiconductor substrate 100 may be fixed to the dicing tape 300, so that the release layer 122 and the carrier substrate 124 may be easily separated from the semiconductor substrate 100.

Hereinafter, preferred embodiments are proposed to more concretely describe the present invention. However, the following examples are only given for illustrating the present invention and those skilled in the related art will obviously understand that various alterations and modifications are possible within the scope and spirit of the present invention. Such alterations and modifications are duly included in the appended claims.

Example 1

In a four-neck round flask, gamma butyrolactone (GBL) as a solvent was added, and 2,2-bis (trifluoromethyl) benzidine (TFMB) and 4,4-(hexafluoroisopropylidene) diphthalic anhydride (6FDA) were added at a molar ratio of 1:1 so that the solid content was 20 wt % to be reacted with each other at 10° C. for 24 hours. Thereafter, water was added in an amount of 0.1 mol based on 1 mol of the dianhydride monomer, and reacted at 50° C. for 24 hours. Thereafter, glycidyl isopropyl ether was added in an amount of 0.1 mol relative to 1 mol of the dianhydride monomer and reacted at 50° C. for 48 hours to prepare an imide precursor composition having a viscosity of 40 cps.

Examples 2 to 20

Imide precursor compositions were prepared by the same method as that in Example 1, except that the reactive monomers were mixed in the components and corresponding molar ratios as shown in Table 1 below.

Comparative Example 1

In a four-neck round flask, gamma butyrolactone (GBL) as a solvent was added, 2,2-bis (trifluoromethyl) benzidine (TFMB) and 4,4-(hexafluoroisopropylidene) diphthalic anhydride (6FDA) was added at a molar ratio of 1:1 so that the solid content was 20 wt %, and reacted at 10° C. for 24 hours. Thereafter, water was added in an amount of 0.1 mol relative to 1 mol of the dianhydride monomer and reacted at 50° C. for 24 hours to prepare an imide precursor composition having a viscosity of 39 cps.

Comparative Examples 2 to 4

Imide precursor compositions were prepared by the same method as that in Comparative Example 1, except that the reacted monomers were mixed with the components and molar ratios as shown in Table 1.

TABLE 1

| No. | diamine monomer (A) | dianhydride monomer (B) | cyclic ether group-containing monomer (C) | viscosity (cps) |
|---|---|---|---|---|
| Example 1 | 1 (A-1) | 1 (B-1) | 0.1 (C-1) | 40 |
| Example 2 | 1 (A-1) | 1 (B-1) | 0.5 (C-1) | 43 |
| Example 3 | 1 (A-1) | 1 (B-1) | 1 (C-1) | 45 |
| Example 4 | 1 (A-1) | 1 (B-1) | 1.5 (C-1) | 47 |
| Example 5 | 1 (A-1) | 1 (B-1) | 0.5 (C-2) | 44 |
| Example 6 | 1 (A-1) | 1 (B-1) | 1 (C-2) | 45 |
| Example 7 | 1 (A-1) | 1 (B-1) | 1.5 (C-2) | 48 |
| Example 8 | 1 (A-1) | 1 (B-1) | 0.5 (C-3) | 45 |
| Example 9 | 1 (A-1) | 1 (B-1) | 1 (C-3) | 46 |
| Example 10 | 1 (A-1) | 1 (B-1) | 1.5 (C-3) | 48 |
| Example 11 | 1 (A-2) | 1 (B-2) | 1 (C-1) | 47 |
| Example 12 | 1 (A-2) | 1 (B-2) | 1 (C-2) | 47 |
| Example 13 | 1 (A-2) | 1 (B-2) | 1 (C-3) | 46 |
| Example 14 | 1 (A-3) | 1 (B-3) | 1 (C-1) | 45 |
| Example 15 | 1 (A-3) | 1 (B-3) | 1 (C-2) | 45 |
| Example 16 | 1 (A-3) | 1 (B-3) | 1 (C-3) | 46 |
| Example 17 | 1 (A-1) | 1 (B-4) | 1 (C-1) | 45 |
| Example 18 | 1 (A-2) | 1 (B-4) | 1 (C-1) | 46 |
| Example 19 | 1 (A-3) | 1 (B-4) | 1 (C-1) | 47 |
| Example 20 | 1 (A-1) | 1 (B-1) | 1.7 (C-1) | 50 |
| Comparative Example 1 | 1 (A-1) | 1 (B-1) | — | 39 |
| Comparative Example 2 | 1 (A-1) | 1 (B-2) | — | 40 |
| Comparative Example 3 | 1 (A-1) | 1 (B-3) | — | 42 |
| Comparative Example 4 | 1 (A-1) | 1 (B-4) | — | 41 |

The specific components listed in Table 1 are as follows.

Diamine Monomer (A)

A-1: 2,2-bis (trifluoromethyl) benzidine (TFMB)

A-2: 4,4-methylene dianiline (MDA)

A-3: 4,4-oxydianiline (ODA)

Dianhydride Monomer (B)

B-1: 4,4-(hexafluoroisopropylidene)diphthalic anhydride (6FDA)

B-2: 3,3',4,4'-biphenyltetracarboxylic acid dianhydride (BPDA)

B-3: 3,3',4',4'-benzophenone tetracarboxylic dianhydride (BTDA)

B-4: 4,4'-oxydiphthalic anhydride (ODPA)

Cyclic Ether Group-Containing Monomer (C)

C-1: glycidyl isopropyl ether

C-2: t-butyl glycidyl ether

C-3: ethyl glycidyl ether

Experimental Example (1) Evaluation on Time-Dependent Stability: Measurement of Viscosity Change Ratio Initial viscosities of the polyimide precursor compositions of Examples and Comparative Examples were measured using a viscosity meter (DV3T, manufactured by Brookfield) at a temperature of 25° C. and a rotational speed of 10 rpm to 60 rpm. Thereafter, after being left for 4 weeks at a temperature of 40° C., viscosities were measured after storage at a temperature of 25° C. and rotational speed of 10 rpm to 60 rpm.

A viscosity change ratio was measured by calculating a changed value of the viscosity after the storage with respect to the initial viscosity as a percentage.

(2) Measurement of Coating Film Thickness Change Ratio

The polyimide precursor composition according to each of Examples and Comparative Examples was spin-coated on a glass substrate at a rotational speed of 1500 rpm. Thereafter, a heat treatment was performed for 1 hour at a temperature of 280° C. in a vacuum using a vacuum oven to prepare a coating film having a thickness of 4500 Å.

An initial thickness of the coating film according to each of Examples and Comparative Examples was measured. Thereafter, the coating film was left at a temperature of 40° C. for 4 weeks, and then the thickness was measured after the storage, and a thickness change ratio was measured by calculating a thickness change value with respect to the initial thickness as a percentage.

TABLE 2

| | viscosity change | | | thickness change of coating film | | |
|---|---|---|---|---|---|---|
| No. | initial viscosity (cP) | viscosity after storage (cP) | change ratio (%) | initial thickness (Å) | thickness after storage (Å) | change ratio (%) |
| Example 1 | 40 | 38 | −5.0 | 4514 | 4421 | −2.1 |
| Example 2 | 43 | 42 | −2.3 | 4578 | 4519 | −1.3 |
| Example 3 | 45 | 44 | −2.2 | 4572 | 4505 | −1.5 |
| Example 4 | 47 | 48 | 2.1 | 4566 | 4515 | −1.1 |
| Example 5 | 44 | 43 | −2.3 | 4553 | 4499 | −1.2 |
| Example 6 | 45 | 44 | −2.2 | 4533 | 4451 | −1.8 |
| Example 7 | 48 | 50 | 4.2 | 4565 | 4495 | −1.5 |
| Example 8 | 45 | 44 | −2.2 | 4592 | 4504 | −1.9 |
| Example 9 | 46 | 46 | 0.0 | 4570 | 4502 | −1.5 |
| Example 10 | 48 | 49 | 2.1 | 4521 | 4452 | −1.5 |
| Example 11 | 47 | 46 | −2.1 | 4569 | 4502 | −1.5 |
| Example 12 | 47 | 46 | −2.1 | 4592 | 4522 | −1.5 |
| Example 13 | 46 | 44 | −4.3 | 4525 | 4463 | −1.4 |
| Example 14 | 45 | 44 | −2.2 | 4524 | 4422 | −2.3 |
| Example 15 | 45 | 44 | −2.2 | 4532 | 4399 | −2.9 |
| Example 16 | 46 | 44 | −4.3 | 4541 | 4415 | −2.8 |
| Example 17 | 45 | 44 | −2.2 | 4521 | 4402 | −2.6 |
| Example 18 | 46 | 45 | −2.2 | 4542 | 4417 | −2.8 |
| Example 19 | 47 | 46 | −2.1 | 4517 | 4403 | −2.5 |
| Example 20 | 50 | 49 | −2.0 | 4531 | 4590 | 1.3 |
| Comparative Example 1 | 39 | 22 | −43.6 | 4517 | 2519 | −44.2 |
| Comparative Example 2 | 40 | 24 | −40.0 | 4515 | 2497 | −44.7 |
| Comparative Example 3 | 42 | 23 | −45.2 | 4517 | 2587 | −42.7 |
| Comparative Example 4 | 41 | 24 | −41.5 | 4520 | 2643 | −41.5 |

Referring to Tables 1 and 2, in the imide precursor compositions according to Examples, the change ratio of viscosity was reduced even after being left at high temperature for a long period. Additionally, in the coating film formed therefrom, the change ration of the thickness was relatively reduced.

However, in the imide precursor composition according to Comparative Examples, the viscosity was greatly changed and the change ratio in the thickness of the coating film was increased.

Therefore, it is confirmed that the imide precursor having a structure derived from the epoxy compound has high a time-dependent stability, and the change ratios of the viscosity and the coating film thickness were small even when stored for a long period under harsh conditions.

Fabrication of Polyimide Film

The polyimide precursor compositions according to Examples and Comparative Examples were spin-coated on a glass substrate at a rotational speed of 1500 rpm. Thereafter, the coating film was formed by heating and drying for 1 hour at a temperature of 120° C. in a vacuum using a vacuum oven. The prepared coating film was heat-treated at a temperature of 280° C. for 1 hour in a vacuum state to prepare a polyimide film having a thickness of 4500 Å.

(3) Measurement of Thermal Decomposition Temperature (Td)

A decomposition temperature (Td) of the polyimide film according to each of Examples and Comparative Examples was measured using a thermogravimetric analyzer (TGA Q500, TA instrument). Specifically, the thermal decomposition temperature (Td) was measured by measuring the temperature when an initial weight of the polyimide film decreased by 1% while raising a temperature from 0° C. to 600° C. at a heating rate of 10° C./min.

(4) Measurement of Coefficient of Thermal Expansion (CTE)

A thermal expansion coefficient (CTE) of the polyimide film according to each of Examples and Comparative Examples was measured at a temperature range from 50° C. to 150° C. under conditions of a heating rate of 10° C./min and a load of 5 g using a thermomechanical analyzer (TMA 2940, TA instrument).

(5) Measurement of Glass Transition Temperature (Tg)

The glass transition temperature (Tg) of the polyimide films according to each of Examples and Comparative Examples was measured using a differential scanning calorimeter (DSC 200F3, Netzsch). Specifically, the glass transition temperature (Tg) was measured by raising a temperature from 25° C. to 400° C. at a heating rate of 10° C./min.

(6) Evaluation on Laser Detachability

The polyimide films according to Examples and Comparative Examples were irradiated with a light having a wavelength of 308 nm using a laser oscillator (XeCl excimer pm848, Light Machinery). Specifically, an energy density of the laser irradiation was 200 mJ/$cm^2$, and a laser overlap was 50%.

Thereafter, a force was applied perpendicularly to one end of the polyimide film to separate the polyimide film from the glass substrate. A Laser detachability was evaluated by observing a residue of the polyimide film on the glass substrate. The evaluation criteria are as follows.

Evaluation Criteria

○: No residue of polyimide film observed on glass substrate

X: Residue of polyimide film observed on glass substrate (7) Measurement of Transmittance A light transmittance at a wavelength of 308 nm of the polyimide film according to each of Examples and Comparative Examples was measured using a UV spectrometer (UV-3600, Shimadzu).

TABLE 3

| | heat resistance | | | | light |
|---|---|---|---|---|---|
| No. | Td (° C.) | CTE (ppm/K) | Tg (° C.) | laser detachability | transmittance (%) |
| Example 1 | 389 | 39 | 337 | ○ | 25 |
| Example 2 | 375 | 42 | 329 | ○ | 23 |
| Example 3 | 373 | 44 | 325 | ○ | 22 |
| Example 4 | 373 | 44 | 322 | ○ | 22 |
| Example 5 | 374 | 42 | 329 | ○ | 23 |
| Example 6 | 372 | 44 | 327 | ○ | 22 |
| Example 7 | 372 | 44 | 325 | ○ | 22 |
| Example 8 | 376 | 42 | 327 | ○ | 23 |
| Example 9 | 374 | 44 | 327 | ○ | 22 |
| Example 10 | 374 | 45 | 325 | ○ | 22 |
| Example 11 | 372 | 44 | 325 | ○ | 22 |
| Example 12 | 369 | 43 | 324 | ○ | 23 |
| Example 13 | 371 | 44 | 329 | ○ | 22 |
| Example 14 | 367 | 43 | 327 | ○ | 22 |
| Example 15 | 372 | 44 | 327 | ○ | 23 |
| Example 16 | 367 | 42 | 325 | ○ | 22 |
| Example 17 | 371 | 44 | 325 | ○ | 21 |
| Example 18 | 369 | 43 | 327 | ○ | 22 |
| Example 19 | 373 | 43 | 324 | ○ | 22 |
| Example 20 | 310 | 70 | 298 | ○ | 20 |
| Comparative Example 1 | 410 | 30 | 342 | X | 40 |
| Comparative Example 2 | 412 | 32 | 341 | X | 41 |
| Comparative Example 3 | 415 | 37 | 347 | X | 42 |
| Comparative Example 4 | 409 | 35 | 344 | X | 40 |

Referring to Tables 1 and 3, the polyimide films according to Examples had high absorbance at 308 nm while maintaining high heat resistance, and the debonding property by the laser irradiation was improved.

However, the polyimide films according to Comparative Examples had low absorbance at a wavelength of 308 nm, and the laser irradiation detachability was deteriorated.

Therefore, it is confirmed that the absorbance at a wavelength of the ultraviolet region, e.g., the wavelength of 308 nm, is increased by the structure derived from the epoxy compound, and thus the laser debonding property is further improved.

What is claimed is:

1. A polyimide precursor composition comprising an imide precursor represented by Chemical Formula 1 or Chemical Formula 2:

[Chemical Formula 1]

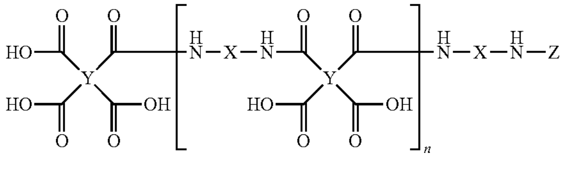

-continued

[Chemical Formula 2]

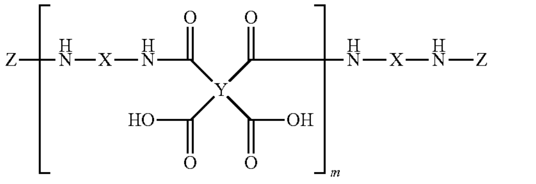

wherein, in Chemical Formulae 1 and 2, X is a divalent aliphatic hydrocarbon group having 6 to 30 carbon atoms or a divalent aromatic hydrocarbon group having 6 to 30 carbon atoms, Y is a tetravalent aliphatic hydrocarbon group having 4 to 30 carbon atoms or a tetravalent aromatic hydrocarbon group having 6 to 30 carbon atoms, Z is a moiety derived from a cyclic ether group-containing compound having 4 to 30 carbon atoms, and the cyclic ether group-containing compound includes at least one selected from the group consisting of t-butyl glycidyl ether, glycidyl isopropyl ether and ethyl glycidyl ether, and n and m are each an integer from 5 to 100.

2. The polyimide precursor composition according to claim 1, wherein the imide precursor is a product of a monomer blend including a diamine compound, a dianhydride compound and the cyclic ether group-containing compound.

3. The polyimide precursor composition according to claim 2, wherein the diamine compound includes a compound represented by Chemical Formula 3:

$H_2N—X—NH_2$ [Chemical Formula 3]

wherein, in Chemical Formula 3, X is a divalent aliphatic hydrocarbon group having 6 to 30 carbon atoms or a divalent aromatic hydrocarbon group having 6 to 30 carbon atoms.

4. The polyimide precursor composition according to claim 3, wherein the diamine compound includes at least one of compounds represented by Chemical Formulae 5 to 9:

[Chemical Formula 5]

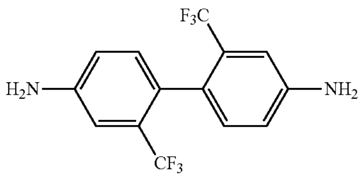

[Chemical Formula 6]

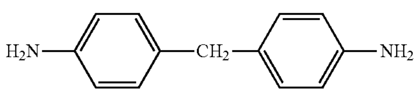

[Chemical Formula 7]

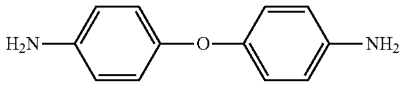

[Chemical Formula 8]

-continued

[Chemical Formula 9]

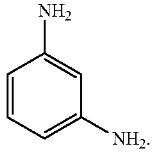

5. The polyimide precursor composition according to claim 2, wherein the dianhydride compound includes a compound represented by Chemical Formula 4:

[Chemical Formula 4]

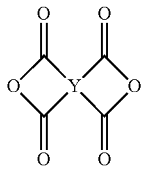

wherein, in Chemical Formula 4, Y is a tetravalent aliphatic hydrocarbon group having 4 to 30 carbon atoms or a tetravalent aromatic hydrocarbon group having 6 to 30 carbon atoms.

6. The polyimide precursor composition according to claim 5, wherein the dianhydride compound includes at least one of the compounds represented by Chemical Formulae 10 to 14:

[Chemical Formula 10]

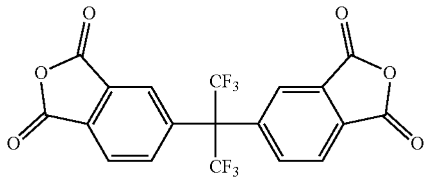

[Chemical Formula 11]

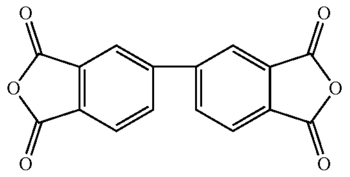

[Chemical Formula 12]

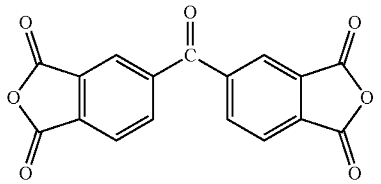

[Chemical Formula 13]

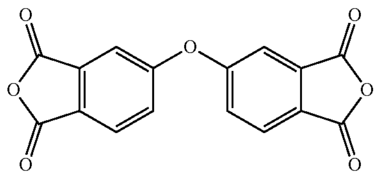

-continued

[Chemical Formula 14]

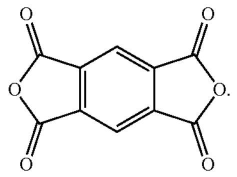

7. The polyimide precursor composition according to claim 2, wherein a content of the cyclic ether group-containing compound in the monomer blend is in a range from 10 moles to 150 moles based on 100 moles of the dianhydride compound.

8. The polyimide precursor composition according to claim 2, wherein a content of the diamine compound in the monomer blend is in a range from 80 moles to 120 moles based on 100 moles of the dianhydride compound.

9. A polyimide film comprising a cured product of the polyimide precursor composition of claim 1.

10. The polyimide film according to claim 9, wherein the polyimide film is used as a release layer for a laser lift off (LLO).

11. The polyimide film according to claim 9, wherein a light transmittance at a wavelength of 308 nm measured at a thickness of 4,500 Å is 25% or less.

12. A method of manufacturing a semiconductor device, the method comprising:

forming a carrier stack that comprises a carrier substrate and a release layer formed from the polyimide precursor composition of claim 1 on a top surface of the semiconductor substrate;

polishing a bottom surface of the semiconductor substrate; and removing the carrier stack from the semiconductor substrate.

13. The method according to claim 12, wherein removing the carrier laminate from the semiconductor substrate comprises:

irradiating the release layer with laser light; and detaching the release layer from the semiconductor substrate.

14. The method according to claim 12, further comprising forming a circuit device on the top surface of the semiconductor substrate before forming the carrier stack on the top surface of the semiconductor substrate, wherein polishing the bottom surface of the semiconductor substrate comprises turning over the semiconductor substrate so that the carrier stack faces downward.

15. The method according to claim 12, further comprising forming a pressure-sensitive adhesive layer on the top surface of the semiconductor substrate before forming the carrier stack on the top surface of the semiconductor substrate; and removing the pressure-sensitive adhesive layer from the semiconductor substrate after removing the carrier stack from the semiconductor substrate.

* * * * *